US012279367B2

(12) United States Patent
Fukushima et al.

(10) Patent No.: US 12,279,367 B2
(45) Date of Patent: Apr. 15, 2025

(54) WIRING CIRCUIT BOARD AND PRODUCING METHOD THEREOF

(71) Applicant: NITTO DENKO CORPORATION, Osaka (JP)

(72) Inventors: Rihito Fukushima, Osaka (JP); Hayato Takakura, Osaka (JP); Naoki Shibata, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 370 days.

(21) Appl. No.: 17/775,797

(22) PCT Filed: Oct. 13, 2020

(86) PCT No.: PCT/JP2020/038643
§ 371 (c)(1),
(2) Date: May 10, 2022

(87) PCT Pub. No.: WO2021/095421
PCT Pub. Date: May 20, 2021

(65) Prior Publication Data
US 2022/0386459 A1 Dec. 1, 2022

(30) Foreign Application Priority Data
Nov. 12, 2019 (JP) .................. 2019-204942

(51) Int. Cl.
*H05K 1/02* (2006.01)
*H05K 3/18* (2006.01)
*H05K 3/46* (2006.01)

(52) U.S. Cl.
CPC ............ *H05K 1/0298* (2013.01); *H05K 3/18* (2013.01); *H05K 3/4644* (2013.01); *H05K 2203/0703* (2013.01)

(58) Field of Classification Search
CPC ................ H05K 1/0298; H05K 3/244; H05K 2201/09672; H05K 3/18; H05K 3/4644; H05K 2203/0703
See application file for complete search history.

(56) References Cited

U.S. PATENT DOCUMENTS

| 9,538,639 B2* | 1/2017 | Tanabe .................. H05K 3/244 |
| 2009/0151994 A1 | 6/2009 | Ohsawa et al. |
| 2015/0245472 A1 | 8/2015 | Tanabe |

FOREIGN PATENT DOCUMENTS

| JP | 2009-129490 A | 6/2009 |
| JP | 2011-082302 A | 4/2011 |

(Continued)

OTHER PUBLICATIONS

International Preliminary Report on Patentability issued by WIPO on May 17, 2022, in connection with International Patent Application No. PCT/JP2020/038643.

(Continued)

*Primary Examiner* — James Wu
(74) *Attorney, Agent, or Firm* — Edwards Neils LLC; Jean C. Edwards, Esq.

(57) ABSTRACT

A wiring circuit board includes a base insulating layer; a first wiring disposed on the base insulating layer; an intermediate insulating layer disposed on the base insulating layer so as to cover the first wiring; a second wiring disposed on the intermediate insulating layer; a single layer first terminal, disposed on the base insulating layer, and electrically connected to the first wiring; and a single layer second terminal, disposed on the base insulating layer, and electrically connected to the second wiring. The first terminal is continuous with the first wiring. The second terminal is discontinuous from the second wiring. The wiring circuit board further includes a connecting portion disposed on the base insulat- (Continued)

ing layer and continuous with the second terminal to electrically connect to the second wiring.

13 Claims, 13 Drawing Sheets

(56) References Cited

FOREIGN PATENT DOCUMENTS

| JP | 2012-089204 A | 5/2012 |
|---|---|---|
| JP | 2012-198957 A | 10/2012 |
| JP | 2015-158963 A | 9/2015 |
| KR | 10-2018-0103859 A | 9/2018 |

OTHER PUBLICATIONS

Office Action, issued by the Japanese Patent Office on Apr. 23, 2024, in connection with Japanese Patent Application No. 2019-204942.
International Search Report issued in PCT/JP2020/038643 on Dec. 15, 2020.
Written Opinion issued in PCT/JP2020/038643 on Dec. 15, 2020.
Office Action, issued by the Japanese Patent Office on Nov. 14, 2023, in connection with Japanese Patent Application No. 2019-204942.
Office Action, issued by the Taiwanese Patent Office on Dec. 15, 2023, in connection with Taiwanese Patent Application No. 109135621.
Reconsideration Report, issued by the Japanese Patent Office on Oct. 8, 2024, in connection with Japanese Patent Application No. 2024-011778.
Office Action issued by the Korean Intellectual Property Office on Nov. 27, 2024, in connection with Korean Patent Application No. 10-2022-7015155.

\* cited by examiner

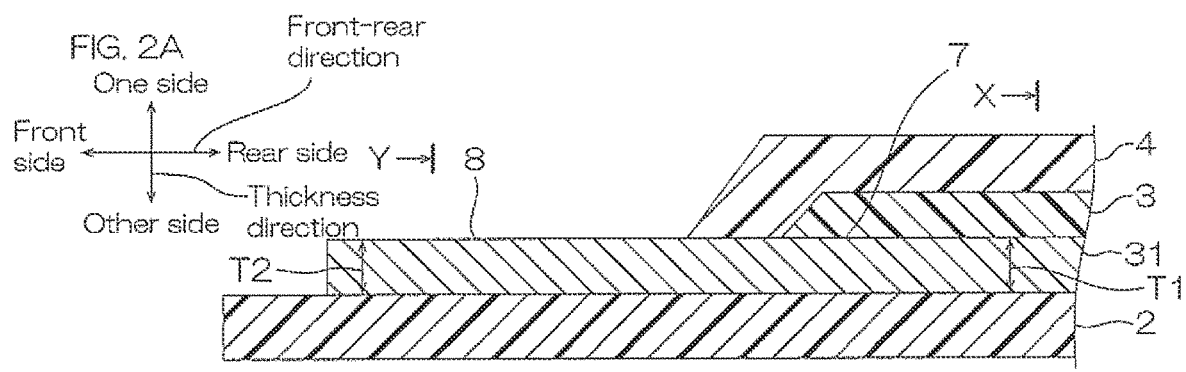
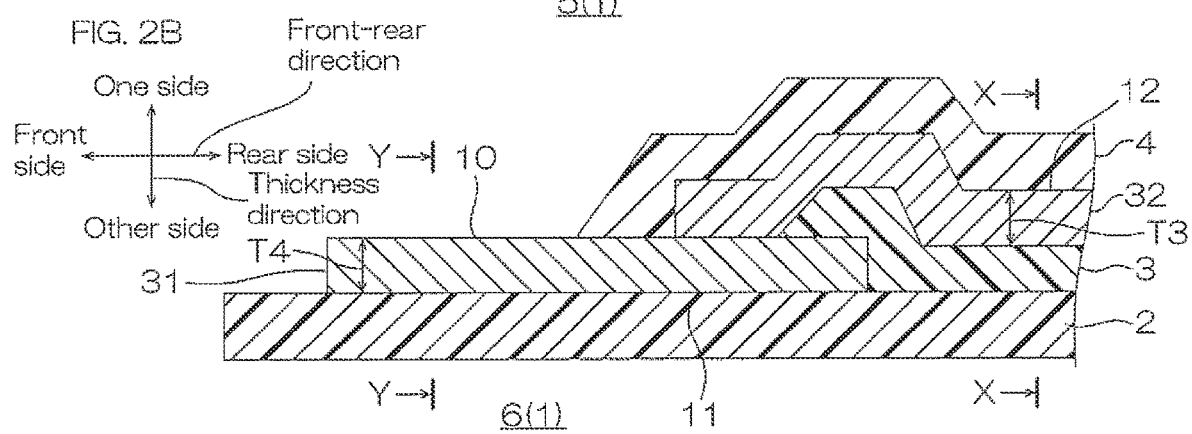
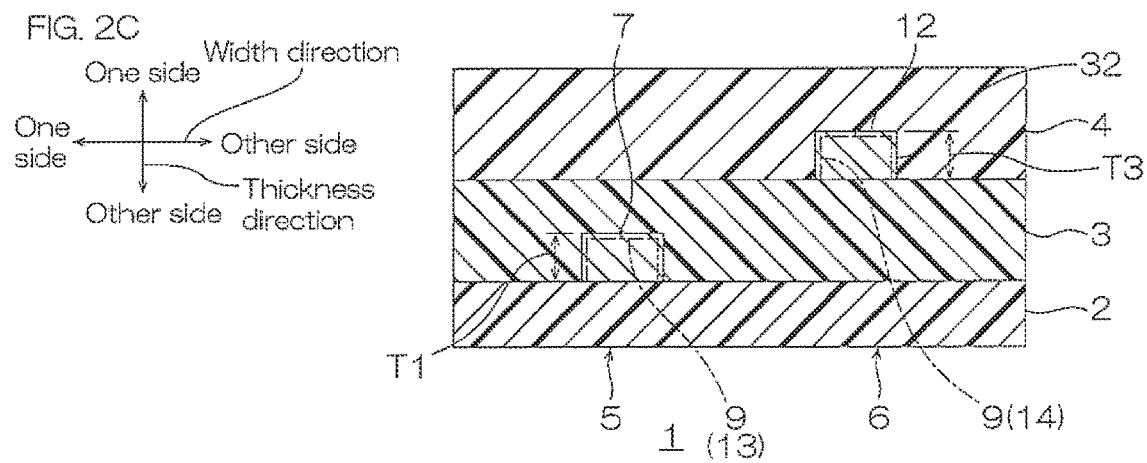
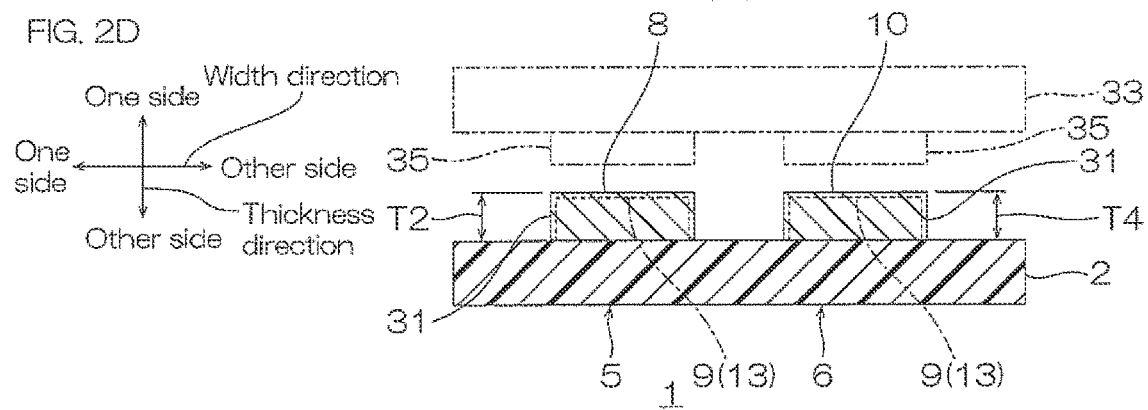

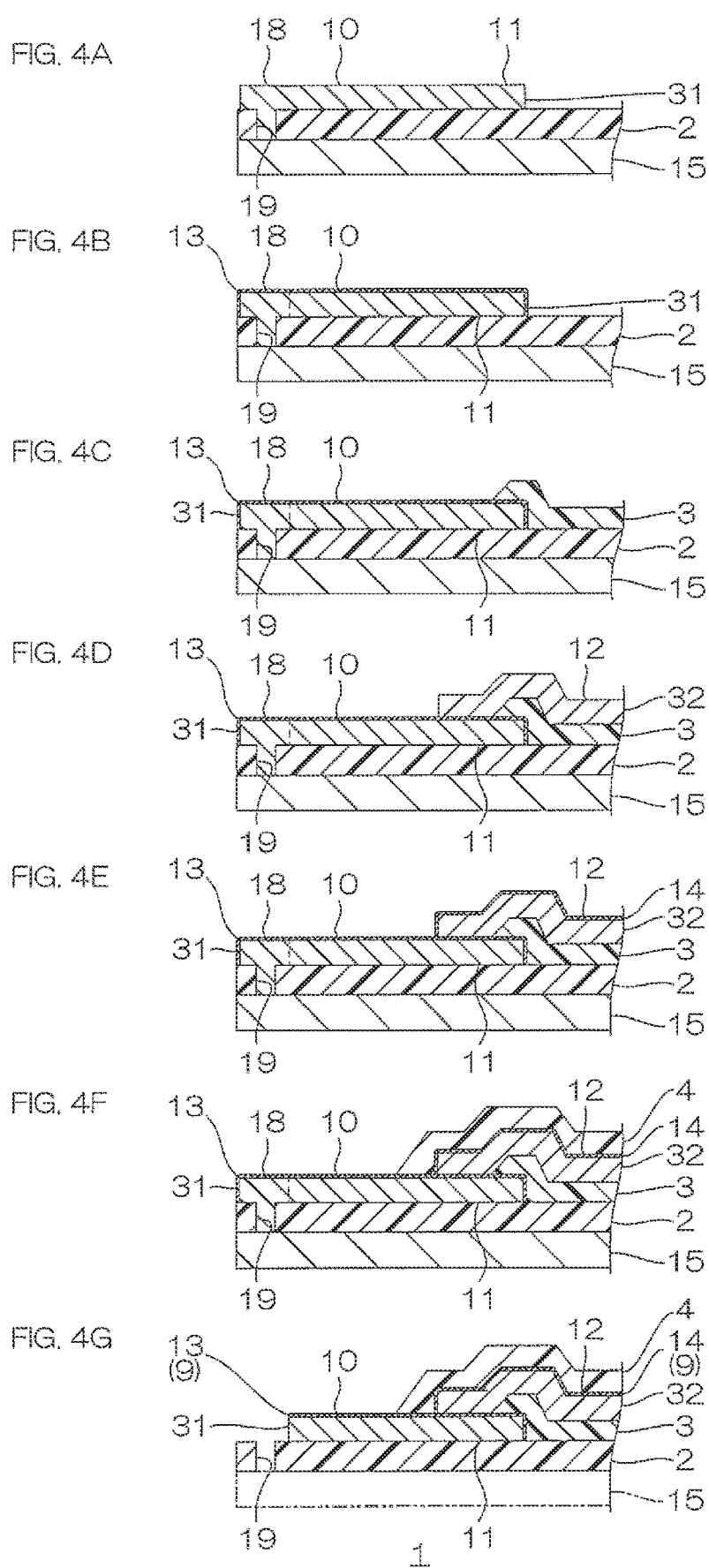

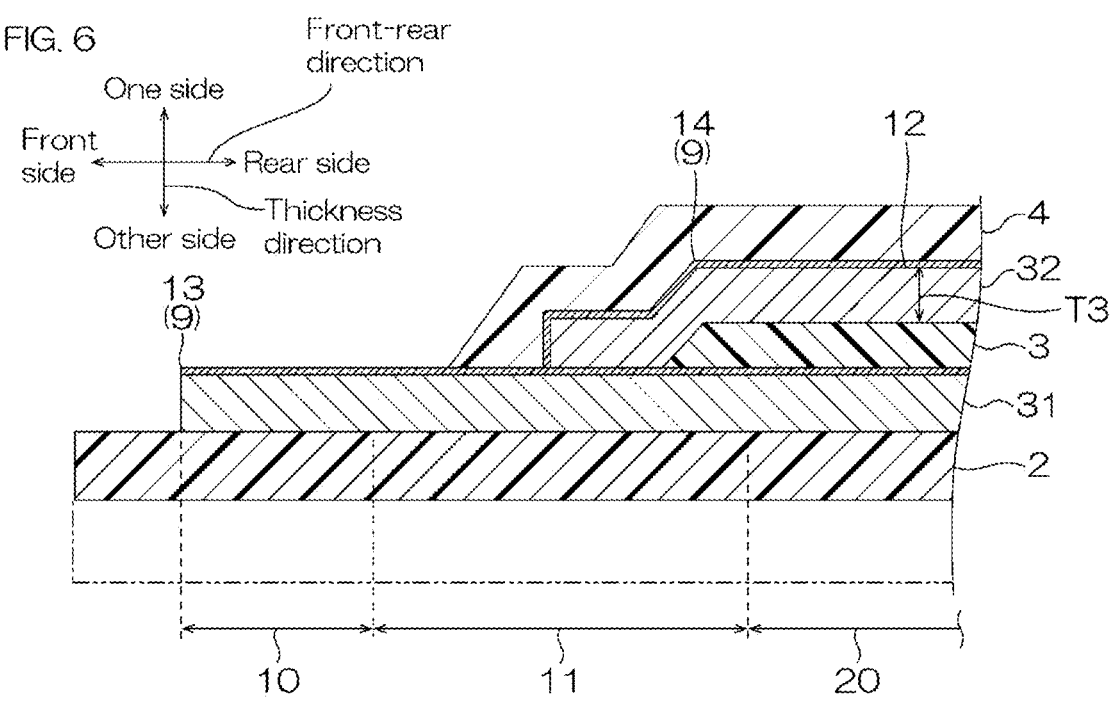

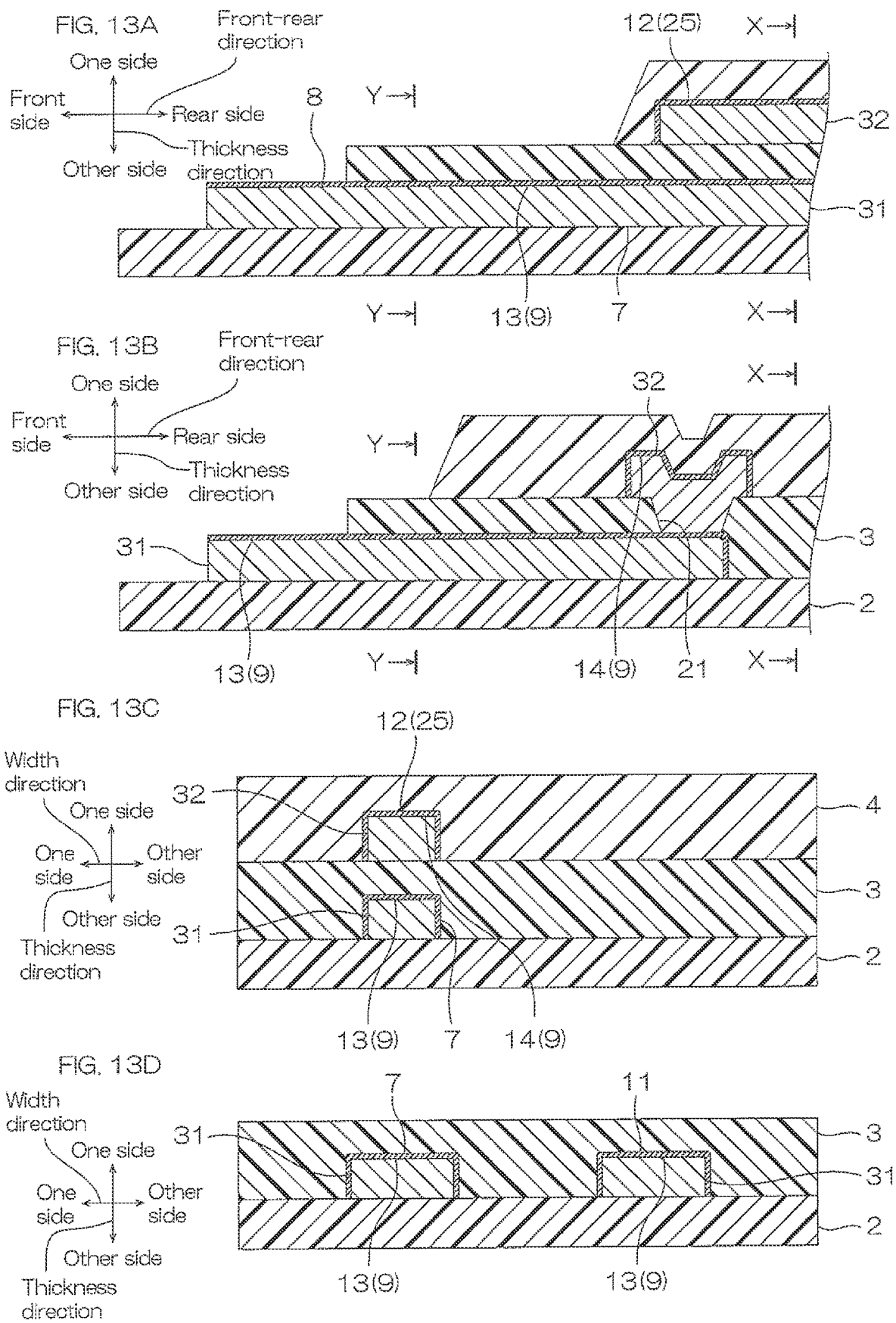

WIRING CIRCUIT BOARD AND PRODUCING METHOD THEREOF

CROSS-REFERENCE TO RELATED APPLICATIONS

The present application is a 35 U.S.C. 371 National Stage Entry of: PCT/JP2020/038643, filed on Oct. 13, 2020, which claims priority from Japanese Patent Application No. 2019-204942, filed on Nov. 12, 2019, the contents of all of which are herein incorporated by reference in their entirety.

TECHNICAL FIELD

The present invention relates to a wiring circuit board, and a method for producing a wiring circuit board.

BACKGROUND ART

Conventionally, a suspension board including a wiring terminal portion has been proposed (ref: for example, Patent Document 1 below). Another electronic device is mounted on the wiring terminal portion.

Further, the wiring terminal portion described in Patent Document 1 includes a first conductive terminal formed on a base insulating layer, and a second conductive terminal formed thereon. The first conductive terminal consists of a first conductive layer. The second conductive terminal consists of a second conductive layer. Each one end portion in a longitudinal direction of the first conductive layer and the second conductive layer is the first conductive terminal and the second conductive terminal, and an intermediate insulating layer is interposed between an intermediate portion in the longitudinal direction of the first conductive layer and the intermediate portion in the longitudinal direction of the second conductive layer.

CITATION LIST

Patent Document

Patent Document 1: Japanese Unexamined Patent Publication No. 2012-198957

SUMMARY OF THE INVENTION

Problem to be Solved by the Invention

Recently, thinning of the wiring terminal portion is required. However, since the wiring terminal portion described in Patent Document 1 consists of two layers of the first conductive terminal consisting of a first conductor and the second conductive terminal consisting of a second conductor, there is a limit in the thinning.

The present invention provides a wiring circuit board including a thin first terminal and a thin second terminal, and a method for producing a wiring circuit board.

Means for Solving the Problem

The present invention (1) includes a wiring circuit board including a base insulating layer; a first wiring disposed on one surface in a thickness direction of the base insulating layer; an intermediate insulating layer disposed on one surface in the thickness direction of the base insulating layer so as to cover the first wiring; a second wiring disposed on one surface in the thickness direction of the intermediate insulating layer; a first terminal, which is a single layer, disposed on one surface in the thickness direction of the base insulating layer, and electrically connected to the first wiring; and a second terminal, which is a single layer, disposed on one surface in the thickness direction of the base insulating layer, and electrically connected to the second wiring; and further including a connecting portion disposed on one surface in the thickness direction of the base insulating layer and continuous with the second terminal, wherein the first terminal is continuous with the first wiring; the second terminal is discontinuous from the second wiring; and the connecting portion is electrically connected to the second wiring in the thickness direction.

The wiring circuit board includes the first terminal, which is a single layer, and the second terminal, which is a single layer, disposed on one surface in the thickness direction of the base insulating layer. Since both the first terminal and the second terminal are disposed on one surface in the thickness direction of the base insulating layer, thinning of these is achieved. Further, since both the first terminal and the second terminal are a single layer, the thinning of these is achieved.

The present invention (2) includes the wiring circuit board described in (1) further including a plating layer disposed on one surface in the thickness direction and a side surface of the first wiring.

In the wiring circuit board, since the plating layer covers the first wiring, it is possible to protect the first wiring.

The present invention (3) includes the wiring circuit board described in (1) or (2), wherein the second terminal has the same thickness as the first terminal.

In the wiring circuit board, since the second terminal has the same thickness as the first terminal, its configuration is simple.

The present invention (4) includes the wiring circuit board described in any one of (1) to (3), wherein the second terminal has a thickness of 20 µm or less.

In the wiring circuit board, since the second terminal has a thickness of 20 µm or less, it is possible to reliably thin the second terminal.

The present invention (5) includes the wiring circuit board described in any one of (1) to (4), wherein the second wiring is thicker than the second terminal.

In the wiring circuit board, it is possible to reduce electrical resistance of the thick second wiring, while thinning the second terminal.

The present invention (6) includes the wiring circuit board described in any one of (1) to (5), wherein the second wiring is thicker than the first wiring.

In the wiring circuit board, it is possible to transmit a current having a high current value with the thick second wiring, while transmitting an electrical signal having a low current value with the thin first wiring.

The present invention (7) includes the wiring circuit board described in any one of (1) to (6) further including an auxiliary wiring disposed on one surface in the thickness direction of the base insulating layer and continuous with the connecting portion.

In the wiring circuit board, it is possible for the second wiring and the auxiliary wiring to constitute a power supply wiring, and increase the total sum of the cross-sectional area of these. Therefore, it is possible to reduce the electrical resistance of the power supply wiring having a high current value. As a result, it is possible to efficiently transmit the power supply current having a high current value.

The present invention (8) includes a method for producing a wiring circuit board including a step of preparing a base insulating layer; a step of forming a first conductive layer including a first wiring, a first terminal continuous with the first wiring, a lead continuous with the first terminal, a connecting portion, and a second terminal continuous with the connecting portion on one surface in a thickness direction of the base insulating layer; a step of forming a plating layer on one surface in the thickness direction and a side surface of the first wiring by plating using the lead; a step of forming an intermediate insulating layer on one surface in the thickness direction of the base insulating layer so as to cover the plating layer; and a step of forming a second conductive layer including a second wiring discontinuous from the second terminal on one surface in the thickness direction of the intermediate insulating layer so as to allow the second wiring to be in contact with one surface in the thickness direction of the connecting portion.

According to the method for producing a wiring circuit board, it is possible to form the plating layer on one surface in the thickness direction and the side surface of the first wiring by plating using the lead.

Effect of the Invention

In the wiring circuit board of the present invention, thinning of a first terminal and a second terminal is achieved.

According to the method for producing a wiring circuit board of the present invention, it is possible to form a plating layer on one surface in a thickness direction and a side surface of a first wiring.

BRIEF DESCRIPTION OF THE DRAWINGS

FIGS. 2A to 2D show cross-sectional views of the wiring circuit board shown in FIG. 1:

FIG. 2A illustrating a cross-sectional view along an A-A line of FIG. 1,

FIG. 2B illustrating a cross-sectional view along a B-B line of FIG. 1,

FIG. 2C illustrating a cross-sectional view along a C-C line of FIG. 1 and along an X-X line of FIGS. 2A to 2B, and FIG. 2D illustrating a cross-sectional view along a D-D line of FIG. 1 and along a Y-Y line of FIGS. 2A to 2B.

FIG. 3A illustrating a first step to a second step,

FIG. 3B illustrating a third step,

FIG. 3C illustrating a fourth step,

FIG. 3D illustrating a seventh step, and

FIG. 3E illustrating an eighth step.

FIGS. 4A to 4G show process cross-sectional views of a method for producing the wiring circuit board shown in FIG. 2B:

FIG. 4A illustrating a first step to a second step,

FIG. 4B illustrating a third step,

FIG. 4C illustrating a fourth step,

FIG. 4D illustrating a fifth step,

FIG. 4E illustrating a sixth step,

FIG. 4F illustrating a seventh step, and

FIG. 4G illustrating an eighth step.

FIG. 5A illustrating a cross-sectional view along an A-A line of FIG. 1,

FIG. 5B illustrating a cross-sectional view along a B-B line of FIG. 1,

FIG. 5C illustrating a cross-sectional view along a C-C line of FIG. 1 and along an X-X line of FIGS. 5A to 5B, and FIG. 5D illustrating a cross-sectional view along a D-D line of FIG. 1 and along a Y-Y line of FIGS. 5A to 5B.

FIG. 6 shows a cross-sectional view of a further modified example (modified example further including an auxiliary wiring) of the wiring circuit board shown in FIG. 2B.

FIG. 11A illustrating a cross-sectional view along an A-A line of FIG. 10,

FIG. 11B illustrating a cross-sectional view along a B-B line of FIG. 10,

FIG. 11C illustrating a cross-sectional view along a C-C line of FIG. 10 and along an X-X line of FIGS. 11A to 11B, and FIG. 11D illustrating a cross-sectional view along a D-D line of FIG. 10 and along a Y-Y line of FIGS. 11A to 11B.

FIGS. 13A to 13D show cross-sectional views of the wiring circuit board shown in FIG. 12:

FIG. 13A illustrating a cross-sectional view along an A-A line of FIG. 12,

FIG. 13B illustrating a cross-sectional view along a B-B line of FIG. 12,

FIG. 13C illustrating a cross-sectional view along a C-C line of FIG. 12 and along an X-X line of FIGS. 13A to 13B, and FIG. 13D illustrating a cross-sectional view along a D-D line of FIG. 12 and along a Y-Y line of FIGS. 13A to 13B.

FIG. 14A illustrating a step of forming a first wiring,

FIG. 14B illustrating a step of forming an intermediate insulating layer,

FIG. 14C illustrating a step of forming a first terminal and a second connecting portion, FIG. 14D illustrating a step of forming a plating layer, FIG. 14E illustrating a step of forming a cover insulating layer, and FIG. 14F illustrating a step of removing a second lead and a metal support layer.

DESCRIPTION OF EMBODIMENTS

One Embodiment

Figure 1:
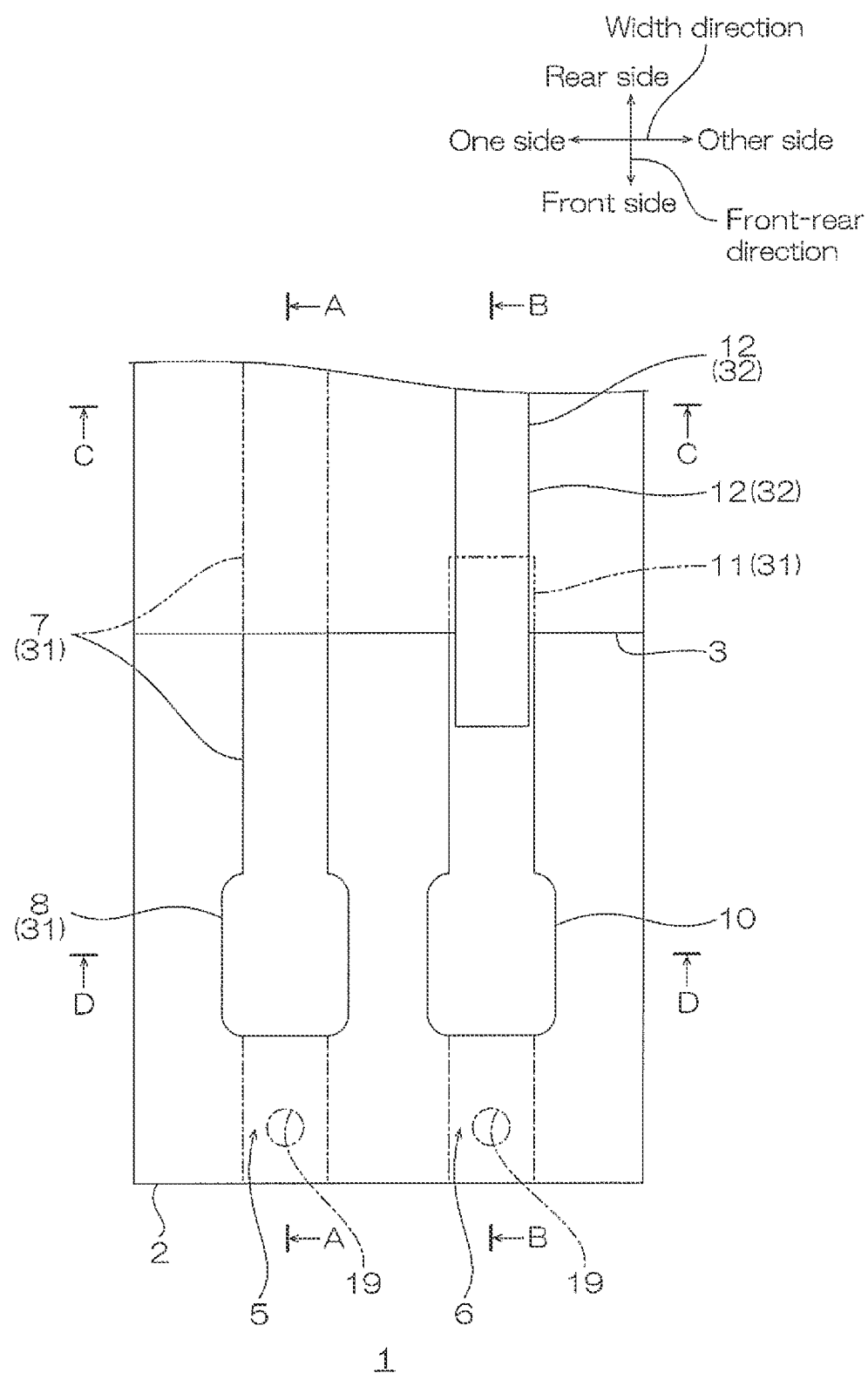
FIG. 1 shows an enlarged plan view of one embodiment of a wiring circuit board of the present invention.

One embodiment of a wiring circuit board and a method for producing a wiring circuit board of the present invention is described with reference to FIGS. 1 to 4G. In FIG. 1, a cover insulating layer 4 (described later) is omitted in order to clearly show the relative arrangement of a first pattern portion 5 and a second pattern portion 6 (described later).

As shown in FIGS. 1 to 2D, a wiring circuit board 1 has a predetermined thickness, and has a flat belt shape extending long in a front-rear direction (up-down direction on the plane of the sheet in FIG. 1, depth direction on the plane of the sheet in FIGS. 2C and 2D). The wiring circuit board 1 includes a base insulating layer 2, an intermediate insulating layer 3, and the cover insulating layer 4 in order toward one side in a thickness direction.

The base insulating layer 2 has the same outer shape as the wiring circuit board 1 when viewed from the top. One surface in the thickness direction of the base insulating layer 2 is flat.

The intermediate insulating layer 3 is disposed on one surface in the thickness direction of the base insulating layer 2. Specifically, the intermediate insulating layer 3 is disposed in a region behind a front-side portion on one surface in the thickness direction of the base insulating layer 2. That is, the intermediate insulating layer 3 is not disposed in the front-side portion on one surface in the thickness direction of the base insulating layer 2. Further, one surface in the thickness direction of the intermediate insulating layer 3 includes a flat surface.

The cover insulating layer 4 is disposed on one surface in the thickness direction of the intermediate insulating layer 3, and one surface in the thickness direction of the base insulating layer 2 which is not overlapped with the intermediate insulating layer 3 in the thickness direction.

Examples of a material for the base insulating layer 2, the intermediate insulating layer 3, and the cover insulating layer 4 include insulating resins such as polyimide. Each of the base insulating layer 2, the intermediate insulating layer 3, and the cover insulating layer 4 has a thickness of, for example, 5 µm or more, and for example, 30 µm or less.

Further, the wiring circuit board 1 includes the first pattern portion 5 and the second pattern portion 6. The first pattern portion 5 is a one-side portion in a width direction (direction perpendicular to the thickness direction and the front-rear direction) of the wiring circuit board 1, and the second pattern portion 6 is an other-side portion in the width direction of the wiring circuit board 1.

As shown in FIG. 1, the first pattern portion 5 extends in the front-rear direction in the wiring circuit board 1. As shown in FIG. 2A, the first pattern portion 5 includes the base insulating layer 2, a first wiring 7, a first terminal 8, the intermediate insulating layer 3, and the cover insulating layer 4.

As shown in FIGS. 2A and 2C, the first wiring 7 is disposed on one surface in the thickness direction of the base insulating layer 2. Specifically, the entire other surface in the thickness direction of the first wiring 7 is in contact with one surface in the thickness direction of the base insulating layer 2. As shown in FIG. 1, the first wiring 7 has a generally linear shape extending in the front-rear direction when viewed from the top.

The first terminal 8 is continuous with the front end edge of the first wiring 7 when viewed from the top. Thus, the first wiring 7 and the first terminal 8 are continuously disposed in order toward the front side. The first terminal 8 is electrically connected to the first wiring 7. The first terminal 8 has a generally rectangular land shape which is wider than the first wiring 7 when viewed from the top.

The first terminal 8 is disposed on one surface in the thickness direction of the base insulating layer 2. Specifically, the entire other surface in the thickness direction of the first terminal 8 is in contact with one surface in the thickness direction of the base insulating layer 2. Then, the first terminal 8 is disposed on one surface in the thickness direction of the base insulating layer 2 which is the same as the first wiring 7.

Further, as shown in FIGS. 2A and 2D, the first terminal 8 is a single layer. In other words, a laminate-type terminal consisting of a laminate (multilayer product) in which a plurality of layers are laminated in the thickness direction is not the first terminal of the present invention. Each of the above-described plurality of layers has a thickness of 1 µm or more.

Examples of a material for the first wiring 7 and the first terminal 8 include conductors such as copper, chromium, and alloys of these.

As shown in FIG. 2A, a thickness T1 of the first wiring 7 and a thickness T2 of the first terminal 8 are, for example, the same or different from each other, and preferably the same. Specifically, the thickness T1 of the first wiring 7 and the thickness T2 of the first terminal 8 are, for example, 3 µm or more, preferably 5 µm or more, and for example, 100 µm or less, preferably 50 µm or less, more preferably 20 µm or less. When the thickness T2 of the first terminal 8 is the above-described upper limit or less, it is possible to thin the first terminal 8.

The first wiring 7 has a width of, for example, 5 µm or more, and for example, 50 µm or less. The width, and a length in the front-rear direction of the first terminal 8 are, for example, 10 µm or more, and for example, 100 µm or less.

As shown in FIGS. 1, 2A, and 2C, the intermediate insulating layer 3 in the first pattern portion 5 does not cover the front-side portion and a rear-side portion (not shown) of the first wiring 7, and covers an intermediate portion in the front-rear direction. The intermediate insulating layer 3 covers one surface in the thickness direction of the intermediate portion in the front-rear direction, and both side surfaces in the width direction of the first wiring 7.

The cover insulating layer 4 in the first pattern portion 5 is disposed on one surface in the thickness direction of the intermediate insulating layer 3.

As shown in FIG. 1, the second pattern portion 6 is adjacent to the other side in the width direction of the first pattern portion 5. The second pattern portion 6 extends in the front-rear direction in the wiring circuit board 1. As shown in FIG. 2B, the second pattern portion 6 includes the base insulating layer 2, a second terminal 10, a connecting portion 11, the intermediate insulating layer 3, a second wiring 12, and the cover insulating layer 4.

As shown in FIGS. 1, 2C, and 2D, the base insulating layer 2 in the second pattern portion 6 is continuous with the base insulating layer 2 in the first pattern portion 5 in the width direction as the same layer.

The second terminal 10 is oppositely disposed at spaced intervals with respect to the first terminal 8 at the other side in the width direction. The second terminal 10 is disposed on one surface in the thickness direction of the base insulating layer 2. Specifically, the entire other surface in the thickness direction of the second terminal 10 is in contact with one surface in the thickness direction of the base insulating layer 2. The second terminal 10 has a generally rectangular land shape when viewed from the top. A thickness T4, a width, and a length in the front-rear direction of the second terminal 10 are the same as the thickness T2, the width, and the length in the front-rear direction of the first terminal 8, respectively. Specifically, the thickness T4 of the second terminal 10 is, for example, 3 µm or more, preferably 5 µm or more, and for example, 100 µm or less, preferably 50 µm or less, more preferably 20 µm or less. When the thickness T4 of the second terminal 10 is the above-described upper limit or less, it is possible to thin the second terminal 10.

Further, the second terminal 10 is a single layer. In other words, a laminate-type terminal consisting of a laminate (multilayer product) in which a plurality of layers are laminated in the thickness direction is not the second terminal of the present invention. Each of the above-described plurality of layers has a thickness of 1 µm or more.

The connecting portion 11 is continuous with the rear end edge of the second terminal 10, and has a generally linear shape extending in the front-rear direction when viewed from the top. Specifically, the connecting portion 11 has a generally rectangular shape which is long and narrow in the front-rear direction when viewed from the top. Further, the connecting portion 11 is oppositely disposed at spaced intervals with respect to the front-side portion of the first wiring 7 at the other side in the width direction. A thickness and a width of the connecting portion 11 are the same as the width of the second wiring 12 to be described later. A length in the front-rear direction of the connecting portion 11 is not particularly limited, and is, for example, 100 µm or more, preferably 1,000 µm or more, and for example, 100,000 µm or less, preferably 10,000 µm or less.

Further, the connecting portion 11 is disposed on one surface in the thickness direction of the base insulating layer 2. Specifically, the entire other surface in the thickness direction of the connecting portion 11 is in contact with one surface in the thickness direction of the base insulating layer 2. Then, the connecting portion 11 and the second terminal 10 are disposed on the same one surface in the thickness direction of the base insulating layer 2. The connecting portion 11 is a single layer.

As shown in FIGS. 2B and 2C, the intermediate insulating layer 3 in the second pattern portion 6 is continuous with the intermediate insulating layer 3 in the first pattern portion 5 in the width direction as the same layer. The intermediate insulating layer 3 is disposed on one surface in the thickness direction of the base insulating layer 2 which is not overlapped with the connecting portion 11 when projected in the thickness direction, one surface in the thickness direction of the rear end portion, both side surfaces in the width direction, and the rear surface (rear end surface) of the connecting portion 11. Thus, the intermediate insulating layer 3 does not cover the front end portion, and the intermediate portion in the front-rear direction of the connecting portion 11, and covers the rear end portion of the connecting portion 11.

As shown in FIG. 1, the second wiring 12 has a generally linear shape extending in the front-rear direction. Specifically, the second wiring 12 has a generally rectangular shape which is long and narrow in the front-rear direction when viewed from the top. The front end portion of the second wiring 12 is overlapped with the rear-side portion of the connecting portion 11 in the thickness direction. Specifically, the other surface in the thickness direction of the front end portion of the second wiring 12 is in contact with one surface in the thickness direction of a portion which is not overlapped with the intermediate insulating layer 3 in the rear-side portion of the connecting portion 11. Thus, the second wiring 12 is electrically connected to the connecting portion 11 in the thickness direction. The second wiring 12 is electrically connected to the second terminal 10 through the connecting portion 11.

On the other hand, the second wiring 12 is discontinuous from the second terminal 10. The second wiring 12 is spaced apart from the second terminal 10 when viewed from the top.

Further, as shown in FIGS. 2B and 2C, the intermediate portion in the front-rear direction, and the rear-side portion of the second wiring 12 are disposed on one surface in the thickness direction of the intermediate insulating layer 3. Specifically, the entire intermediate portion in the front-rear direction, and the entire other surface in the thickness direction of the rear-side portion of the second wiring 12 are in contact with one surface in the thickness direction of the intermediate insulating layer 3.

As shown in FIG. 2C, a thickness T3 of the second wiring 12 is, for example, the same as or different from the thickness T1 of the first wiring 7, and preferably the same. A width of the second wiring 12 is, for example, the same as that of the first wiring 7. Further, as shown in FIG. 2B, the thickness T3 of the second wiring 12 is, for example, the same as the thickness T4 of the second terminal 10.

As a material for the second terminal 10, the connecting portion 11, and the second wiring 12, for example, the same material as that for the first wiring 7 and the first terminal 8 is used.

As shown in FIG. 2C, the cover insulating layer 4 in the second pattern portion 6 is continuous with the cover insulating layer 4 in the first pattern portion 5 in the width direction as the same layer. The cover insulating layer 4 is disposed on one surface in the thickness direction of the intermediate insulating layer 3 so as to cover the second wiring 12. The cover insulating layer 4 covers one surface in the thickness direction and both side surfaces in the width direction of the second wiring 12, and one surface in the thickness direction of the intermediate insulating layer 3 which is not overlapped with the second wiring 12 in the thickness direction.

Figure 3A:
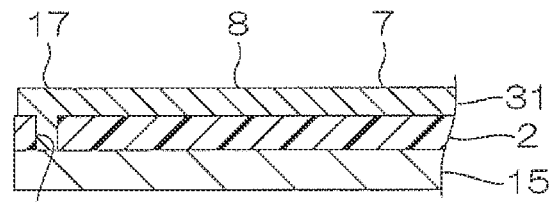
FIGS. 3A to 3E show process cross-sectional views of a method for producing the wiring circuit board shown in FIG. 2A.
Figure 3B:
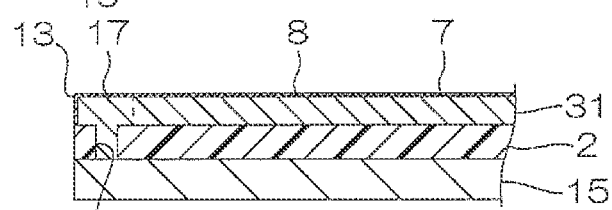
Figure 3C:
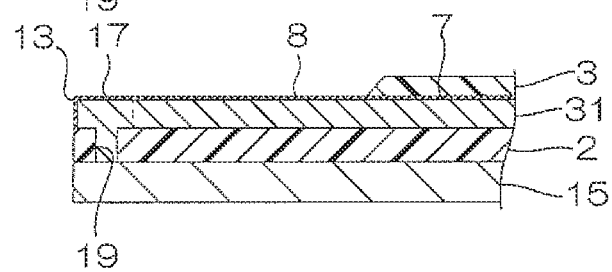
Figure 3D:
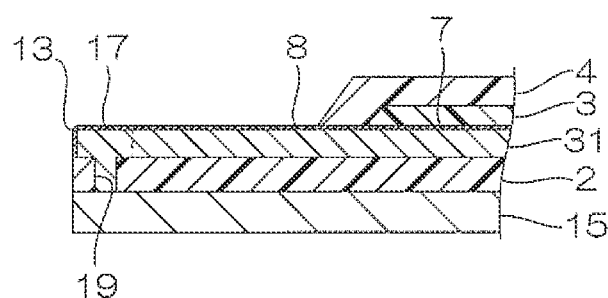
Figure 3E:
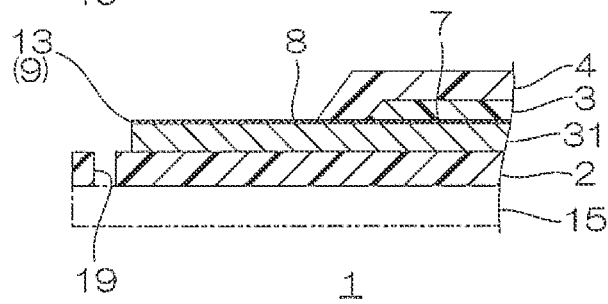

Further, as shown in FIGS. 3E and 4G, the wiring circuit board 1 further includes a plating layer 9. The plating layer 9 is formed on the surfaces of the first wiring 7, the first terminal 8, the second terminal 10, the connecting portion 11, and the second wiring 12. The plating layer 9 protects the surfaces of the first wiring 7, the first terminal 8, the second terminal 10, the connecting portion 11, and the second wiring 12. The plating layer 9 includes a first plating layer 13 and a second plating layer 14.

The first plating layer 13 is formed on the surfaces of the first wiring 7, the first terminal 8, the second terminal 10, and the connecting portion 11. Specifically, the first plating layer 13 is formed on one surface in the thickness direction and both side surfaces in the width direction of the first wiring 7, one surface in the thickness direction and both side surfaces in the width direction of the first terminal 8, one surface in the thickness direction, both side surfaces in the width direction, and the rear side surface of the connecting portion 11, and one surface in the thickness direction and both side surfaces in the width direction of the second terminal 10. Examples of a material for the first plating layer 13 include metal materials such as nickel, gold, and alloys of these. The first plating layer 13 has a thickness of, for example, 0.01 µm or more, preferably 0.02 µm or more, and for example, below 1 µm, preferably 0.5 µm or less. As shown in FIGS. 3E and 4G, an interface between the first plating layer 13 and the first wiring 7, the first terminal 8, the second terminal 10, and the connecting portion 11 is clearly visually confirmed. However, for example, as shown by a dotted line of FIGS. 2C to 2D, the interface may be also unclear, and the first plating layer 13, the first wiring 7, the first terminal 8, the second terminal 10, and the connecting portion 11 may be also integrally formed (the first plating layer 13 may be included in the surface layer of the first wiring 7, the first terminal 8, the second terminal 10, and the connecting portion 11). The first plating layer 13 may be also a plurality of layers.

As shown in FIG. 4G, the second plating layer 14 is formed on the surface of the second wiring 12. Specifically, the second plating layer 14 is formed on one surface in the thickness direction, the front-side surface (front end surface), and both side surfaces in the width direction of the second wiring 12. As a material for the second plating layer 14, the same material as that for the first plating layer 13 is used. A thickness of the second plating layer 14 is selected from the range illustrated in the thickness of the first plating layer 13. As shown in FIG. 4G, an interface between the second plating layer 14 and the second wiring 12 is clearly visually confirmed. However, for example, as shown by the dotted line of FIG. 2C, the interface may be also unclear, and the second plating layer 14 and the second wiring 12 may be also integrally formed (the second plating layer 14 may be included in the surface layer of the second wiring 12). The second plating layer 14 may be also a plurality of layers.

Next, a method for producing the wiring circuit board 1 is described. As shown in FIGS. 3A to 4G, the method for producing the wired circuit board 1 includes a first step of preparing the base insulating layer 2; a second step of forming a first conductive layer 31 including the first wiring 7, the first terminal 8, the second terminal 10, and the connecting portion 11; a third step of forming the first plating layer 13; a fourth step of forming the intermediate insulating layer 3; a fifth step of forming a second conductive layer 32 including the second wiring 12; a sixth step of forming the second plating layer 14; a seventh step of forming the cover insulating layer 4; and an eighth step of removing a first lead 17, a second lead 18, and a metal support layer 15. The first step to the eighth step are carried out in order.

In the first step, as referred to FIGS. 3A and 4A, first, the base insulating layer 2 is formed on one surface in the thickness direction of the metal support layer 15.

The metal support layer 15 is a support member which supports the base insulating layer 2. Further, the metal support layer 15 is also a grounding member at the time of electroless plating (ref: FIGS. 3B and 4B) in the third step and the sixth step to be described later, and/or an electrically conductive member at the time of electrolytic plating (ref: FIGS. 3B and 4B) in the third step and the sixth step to be described later. The metal support layer 15 has a sheet shape extending in the plane direction. Examples of a material for the metal support layer 15 include metals such as iron, copper, and alloys (stainless steel, copper alloy, and the like). A thickness of the metal support layer 15 is not particularly limited.

The base insulating layer 2 is, for example, formed on one surface in the thickness direction of the metal support layer 15 by photolithography of a photosensitive insulating resin composition. At this time, a through hole 19 is formed in the front end portion of the base insulating layer 2. The through hole 19 penetrates the base insulating layer 2 in the thickness direction. The through hole 19 exposes a portion of one surface in the thickness direction of the metal support layer 15.

In the second step, the first conductive layer 31 including the first wiring 7, the first terminal 8, the second terminal 10, and the connecting portion 11 is formed at one time. Further, at this time, the first lead 17 and the second lead 18 as one example of a lead are also formed. The first lead 17 is included in the first conductive layer 31. The first lead 17 and the second lead 18 are separated (ref: dotted line of FIG. 1) or integrated. The first conductive layer 31 is a single layer. The first lead 17 is formed so as to be continuous with the front end edge of the first terminal 8 and fill the through hole 19. The second lead 18 is formed so as to be continuous with the front end edge of the second terminal 10 and fill the through hole 19.

The first conductive layer 31 is formed at one time, for example, by a pattern forming method such as additive method and subtractive method, preferably by an additive method.

As shown in FIGS. 3B and 4B, in the third step, the first plating layer 13 is formed.

The first plating layer 13 is formed on the surface of the first conductive layer 31 at one time, for example, by electroless plating and/or electrolytic plating.

As shown in FIG. 3B, in the electroless plating, the uniform first plating layer 13 is formed on the surfaces of the first terminal 8 and the first wiring 7, while the first terminal 8 and the first wiring 7 are grounded by the first lead 17. Also, the first plating layer 13 is formed on the surface of the first lead 17.

As shown in FIG. 4B, in the electroless plating, the uniform first plating layer 13 is formed on the surfaces of the second terminal 10 and the connecting portion 11, while the second terminal 10 and the connecting portion 11 are grounded through the second lead 18. Also, the first plating layer 13 is formed on the surface of the second lead 18.

Further, as shown in FIG. 3B, in the electrolytic plating, electricity is supplied to the first terminal 8 and the first wiring 7 by the first lead 17, and the first plating layer 13 is formed on the surfaces of the first terminal 8 and the first wiring 7. Also, the first plating layer 13 is formed on the surface of the first lead 17.

Further, as shown in FIG. 4B, in the electrolytic plating, electricity is supplied to the second terminal 10 and the connecting portion 11 by the second lead 18, and the first plating layer 13 is formed on the surfaces of the second terminal 10 and the connecting portion 11. Also, the first plating layer 13 is formed on the surface of the second lead 18.

As shown in FIGS. 3C and 4C, in the fourth step, the intermediate insulating layer 3 is formed. The intermediate insulating layer 3 is formed in the same manner as the formation of the base insulating layer 2 in the first step. The intermediate insulating layer 3 is formed on one surface in the thickness direction of the base insulating layer 2 so as to cover the first plating layer 13 corresponding to the intermediate portion in the front-rear direction of the first wiring 7, and the first plating layer 13 corresponding to the rear end portion of the connecting portion 11.

As shown in FIG. 4D, in the fifth step, the second conductive layer 32 including the second wiring 12 is formed. The second conductive layer 32 is a single layer. The second conductive layer 32 is formed in the same manner as the formation of the first conductive layer 31 in the second step. The second conductive layer 32 including the second wiring 12 is continuously formed on one surface in the thickness direction of the intermediate insulating layer 3 and one surface in the thickness direction of the first plating layer 13 corresponding to the connecting portion 11.

As shown in FIG. 4E, in the sixth step, the second plating layer 14 is formed. The second plating layer 14 is formed in the same manner as the first plating layer 13. The second plating layer 14 is formed, for example, in the same manner as the third step.

In the electroless plating, the uniform second plating layer 14 is formed on the surface of the second wiring 12, while the second wiring 12 is grounded by the second lead 18, the second terminal 10, and the connecting portion 11.

On the other hand, in the electrolytic plating, electricity is supplied to the second wiring 12 by the second lead 18, the second terminal 10, and the connecting portion 11, and the second plating layer 14 is formed on the surface of the second wiring 12. Also, the second plating layer 14 is formed on the surface of the first lead 17.

As shown in FIGS. 2C, 3D, and 4F, in the seventh step, the cover insulating layer 4 is formed. The cover insulating layer 4 is formed in the same manner as the base insulating layer 2 in the first step. The cover insulating layer 4 is formed on one surface in the thickness direction of the intermediate insulating layer 3 so as to cover the second plating layer 14.

In the eighth step, as shown by a solid line of FIG. 3E and the solid line of FIG. 4G, first, the first lead 17 and the second lead 18 are removed. For example, the first lead 17 and the second lead 18 are etched.

In the eighth step, thereafter, as shown by a phantom line of FIG. 3E and the phantom line of FIG. 4G, the metal support layer 15 is removed (eighth step). For example, the metal support layer 15 is etched, peeled, and the like.

Thus, the wiring circuit board 1 is obtained.

Further, if necessary, the area including the through hole 19 in the base insulating layer 2 may be also removed by trimming.

Function and Effect of First Embodiment

Then, the wiring circuit board 1 includes the first terminal 8, which is a single layer, and the second terminal 10, which is a single layer, disposed on one surface in the thickness direction of the base insulating layer 2. Since both the first terminal 8 and the second terminal 10 are disposed on one surface in the thickness direction of the base insulating layer 2, thinning of these is achieved. Further, since both the first terminal 8 and the second terminal 10 are a single layer, the thinning of these is achieved.

Further, in the wiring circuit board 1, since the first plating layer 13 covers the first wiring 7, it is possible to protect the first wiring 7.

As shown in FIG. 2D, in the wiring circuit board 1, since the thickness T4 of the second terminal 10 is the same as the thickness T2 of the first terminal 8, for example, when an external board 33 including two electrodes 35 on the other surface in the thickness direction is mounted on the front end portion of the wiring circuit board 1, it is possible to easily and reliably bring the two electrodes 35 which are at the same height (level) into contact with one surface in the thickness direction of the first terminal 8 and the second terminal 10 having the same thickness.

Further, in the wiring circuit board 1, when the thickness T4 of the second terminal 10 is 20 μm or less, it is possible to reliably thin the second terminal 10.

Modified Examples

In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

Figure 5A:
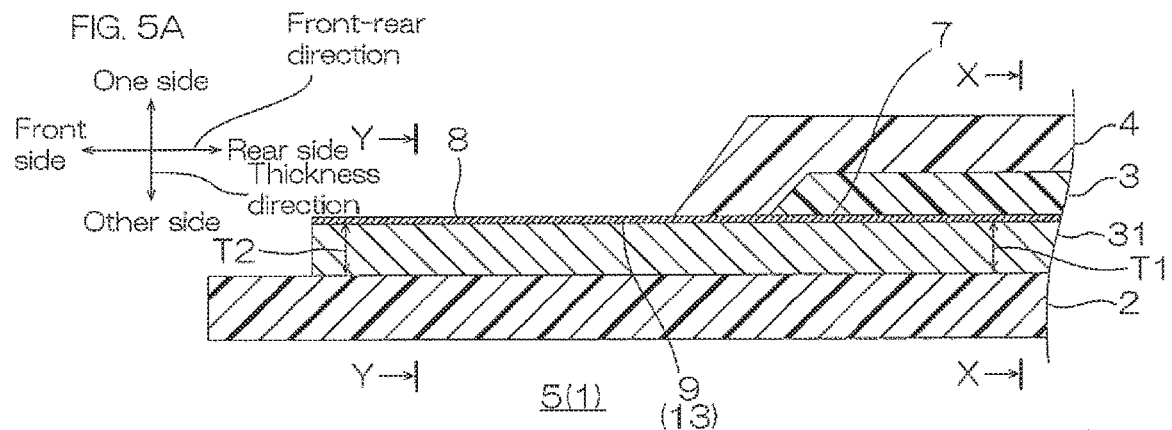
FIGS. 5A to 5D show a modified example (modified example in which a second wiring is thick) of a wiring circuit board of the present invention, and show cross-sectional views corresponding to FIG. 1.
Figure 5B:
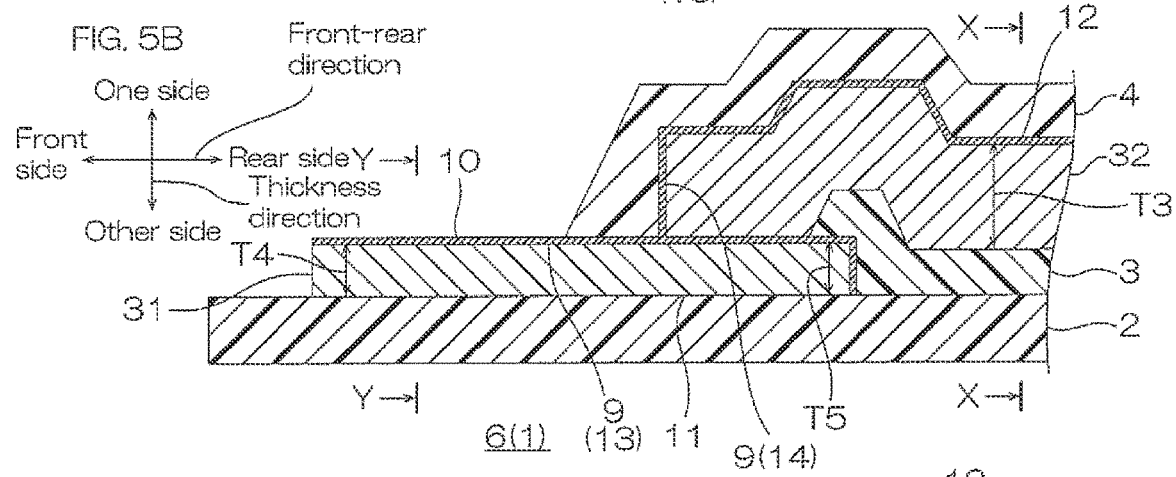
Figure 5C:
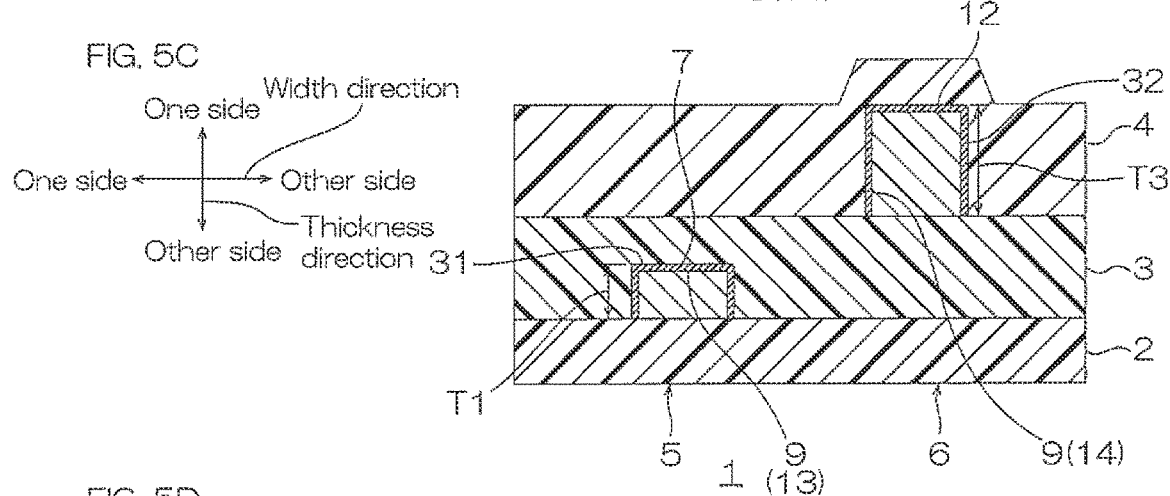
Figure 5D:
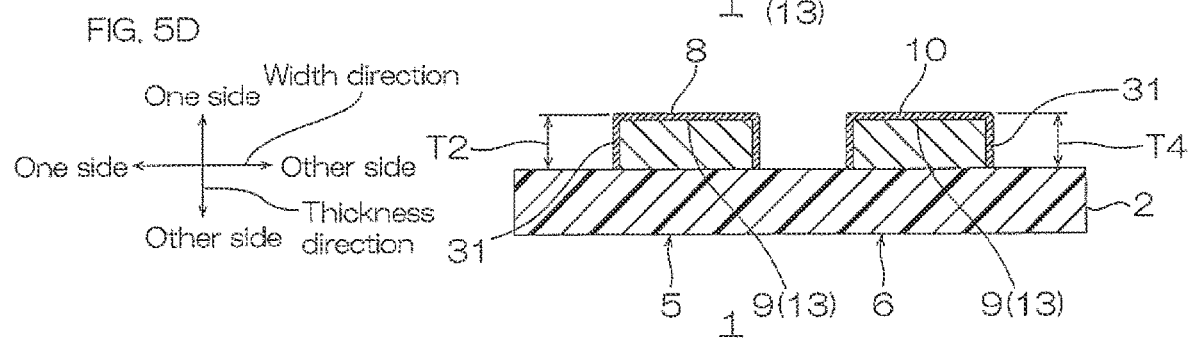

In the modified example, as shown in FIGS. 5B and 5C, the thickness T3 of the second wiring 12 is thicker than the thickness T4 of the second terminal 10. Specifically, a ratio (T3/T4) of the thickness T3 of the second wiring 12 to the thickness T4 of the second terminal 10 is, for example, 1.1 or more, preferably 1.5 or more, more preferably 2 or more, and for example, 10 or less.

In the modified example, the second wiring 12 transmits, for example, a power supply current (large current of, for example, 10 mA or more, furthermore 100 mA or more).

In the modified example, it is possible to transmit the power supply current having a high current value with the thick second wiring 12, while thinning the second terminal 10. Furthermore, when the ratio (T3/T4) is the above-described lower limit or more, it is possible to improve the above-described effect. In this case, the connecting portion 11 continuous with the second terminal 10 is widened.

The thickness T3 of the second wiring 12 is thicker than the thickness T1 of the first wiring 7. A ratio (T3/T1) of the thickness T3 of the second wiring 12 to the thickness T1 of the first wiring 7 is, for example, 1.1 or more, preferably 1.5 or more, more preferably 2 or more, and for example, 10 or less.

The first wiring 7 specifically transmits an electrical signal (weak current of, for example, below 10 mA, furthermore below 1 mA).

In the modified example, it is possible to transmit the power supply current having a high current value with the thick second wiring 12, while transmitting the weak electrical signal with the thin first wiring 7. Furthermore, when the ratio (T3/T1) is the above-described lower limit or more, it is possible to improve the above-described effect.

As shown in FIG. 6, the wiring circuit board 1 further includes an auxiliary wiring 20.

In the modified example, the second pattern portion 6 includes the auxiliary wiring 20.

The auxiliary wiring 20 is disposed on one surface in the thickness direction of the base insulating layer 2, and is continuous with the connecting portion 11. The auxiliary wiring 20 is included in the first conductive layer 31. The auxiliary wiring 20 has a linear shape extending from the rear end edge of the connecting portion 11 toward the rear side. In the modified example, the auxiliary wiring 20 is overlapped with the second wiring 12 when projected in the thickness direction. The intermediate insulating layer 3 is interposed between the auxiliary wiring 20 and the second wiring 12.

In the modified example, when the second terminal 10 is used as the power supply terminal, the power supply current having a high current value which is input into the second terminal 10 branches out into the second wiring 12 and the auxiliary wiring 20. The second wiring 12 and the auxiliary wiring 20 function as power supply wirings.

On the other hand, in one embodiment, only the second wiring 12 functions as a power supply wiring. Therefore, the cross-sectional area of the power supply wiring (the area of a cross-section perpendicular to a transmission direction of the current) is small.

On the other hand, in the modified example, the total sum of the cross-sectional area of the second wiring 12 and the auxiliary wiring 20 is larger than that of one embodiment.

Therefore, it is possible to reduce electrical resistance of the power supply wiring. As a result, it is possible to efficiently transmit the power supply current having a high current value.

Figure 7:
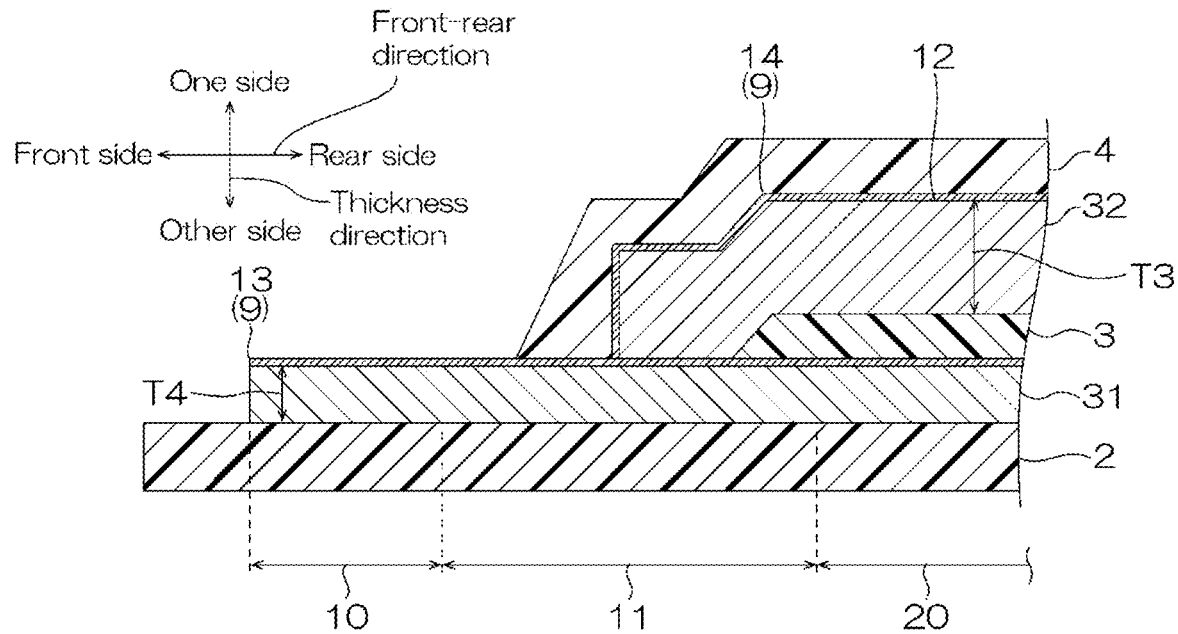
FIG. 7 shows a cross-sectional view of a further modified example (modified example in which a second wiring is thick) of the wiring circuit board shown in FIG. 6.

Further, as shown in FIG. 7, it is possible to thicken the thickness T3 of the second wiring 12 of the modified example shown in FIG. 6, and specifically, make the thickness T3 of the second wiring 12 thicker than the thickness T4 of the second terminal 10 and the thickness T1 of the first wiring 7 (ref: FIG. 5A).

Thus, it is possible to furthermore increase the total sum of the cross-sectional area of the power supply wiring consisting of the second wiring 12 and the auxiliary wiring 20, and therefore, it is possible to furthermore reduce the electrical resistance of the power supply wiring. As a result, it is possible to furthermore efficiently transmit the power supply current having a high current value.

Figure 8:
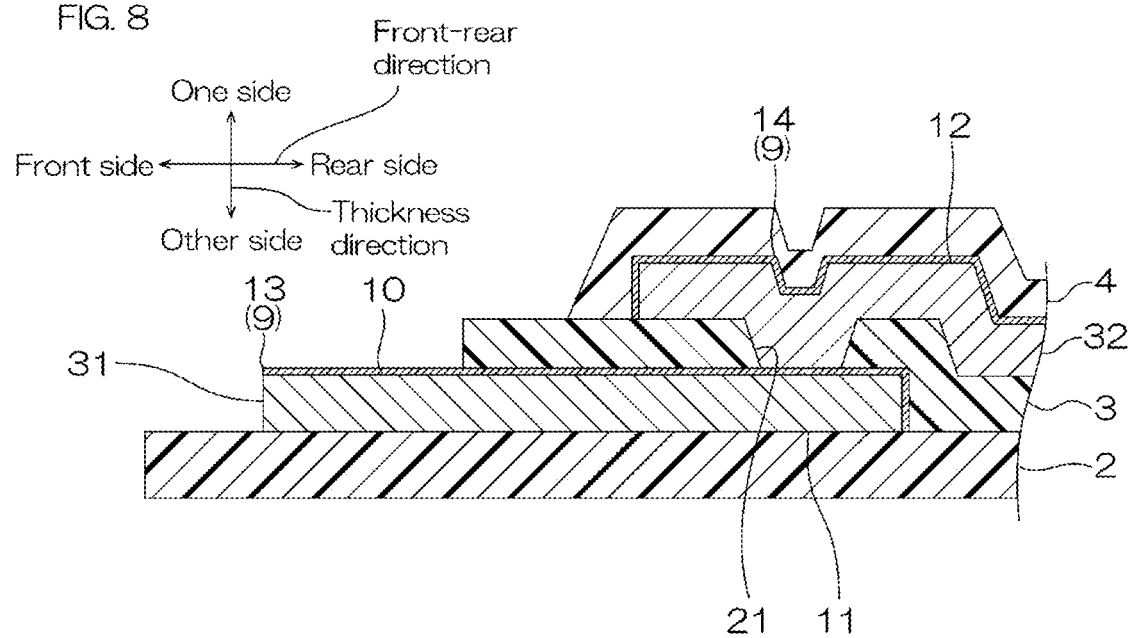
FIG. 8 shows a cross-sectional view of a further modified example (modified example in which a second wiring is connected to a connecting portion through an intermediate via) of the wiring circuit board shown in FIG. 2B.

As shown in FIG. 8, it is possible to electrically connect the front-side portion of the second wiring 12 to the connecting portion 11 through an intermediate via 21.

The intermediate via 21 is a through hole penetrating the intermediate insulating layer 3 in the thickness direction. A portion of the front-side portion of the second wiring 12 fills the intermediate via 21. In the intermediate via 21, the other surface in the thickness direction of the second wiring 12 is in contact with one surface in the thickness direction of the connecting portion 11.

Figure 9:
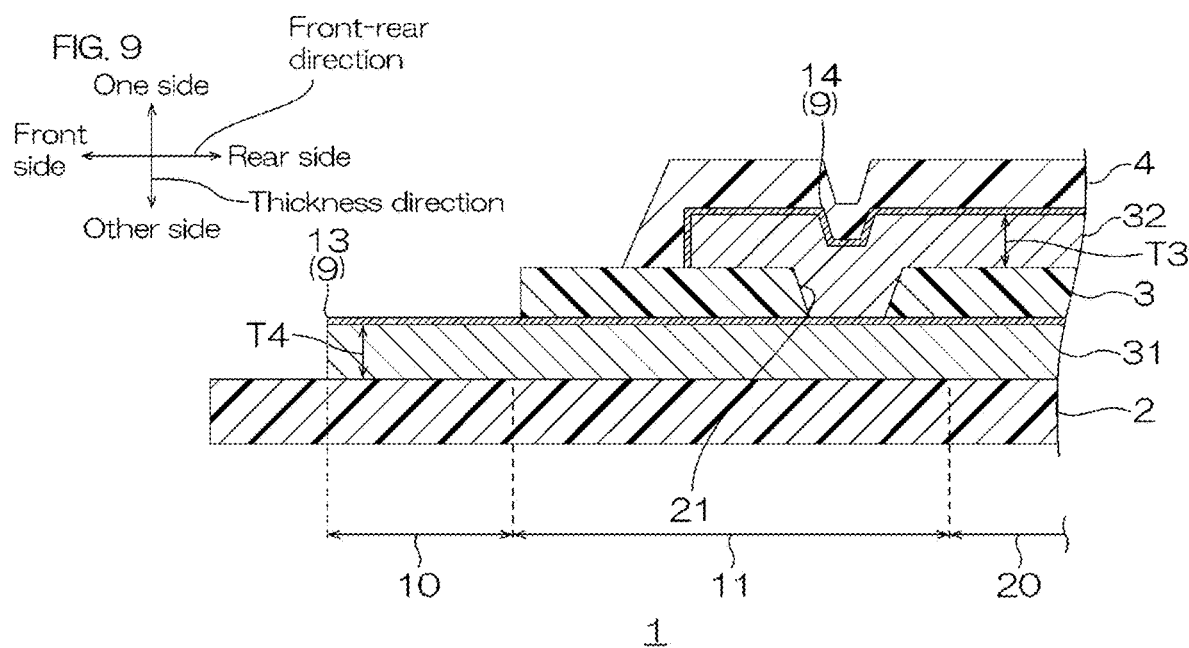
FIG. 9 shows a cross-sectional view of a further modified example (modified example further including an auxiliary wiring) of the wiring circuit board shown in FIG. 8.

As shown in FIG. 9, the connecting portion 11 shown in FIG. 8 may be continuous with the auxiliary wiring 20.

Figure 10:
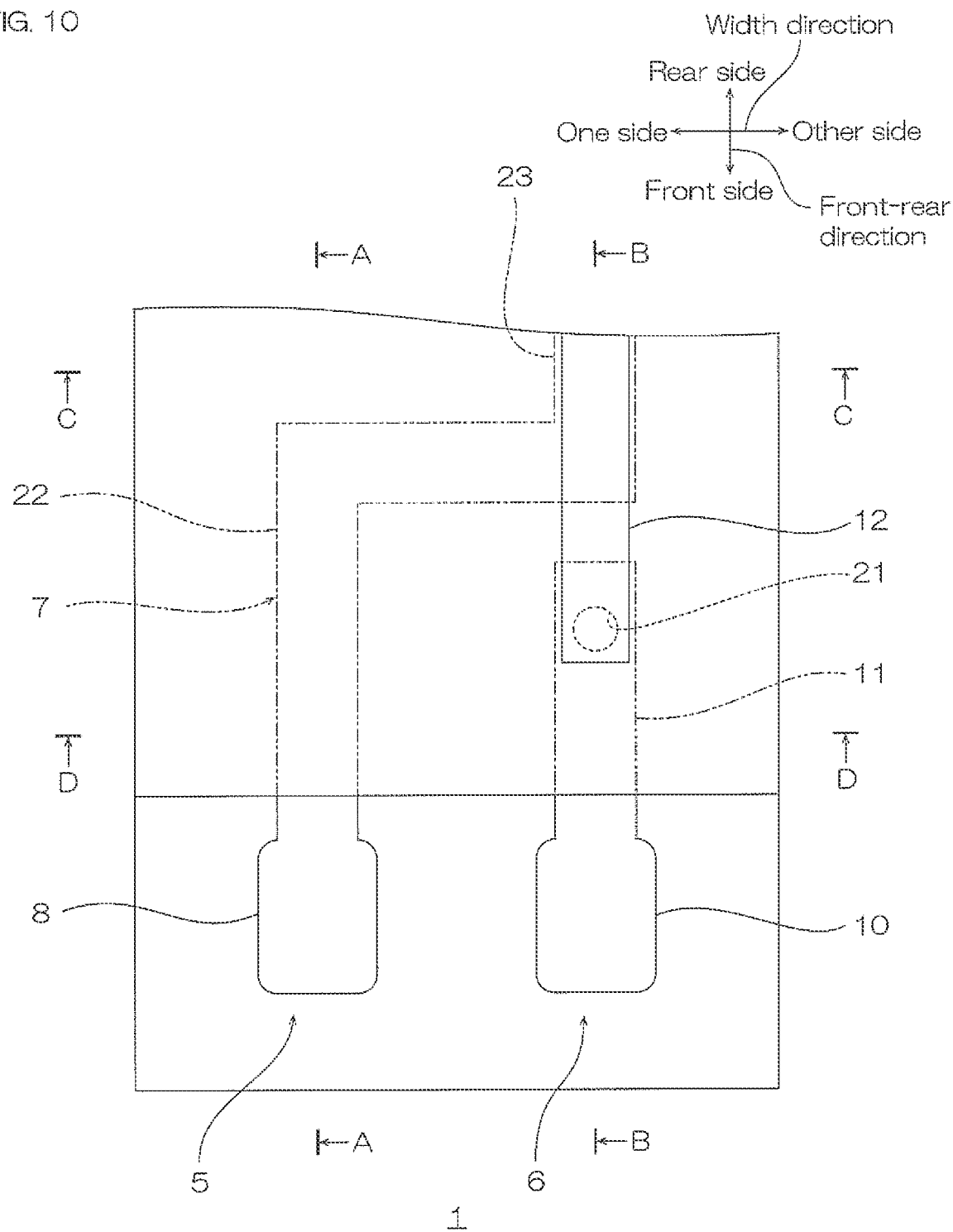
FIG. 10 shows a plan view of a modified example (modified example in which a first pattern portion and a second pattern portion are partially overlapped, and a first wiring is bent when viewed from the top) of the wiring circuit board shown in FIG. 1.
Figure 12:
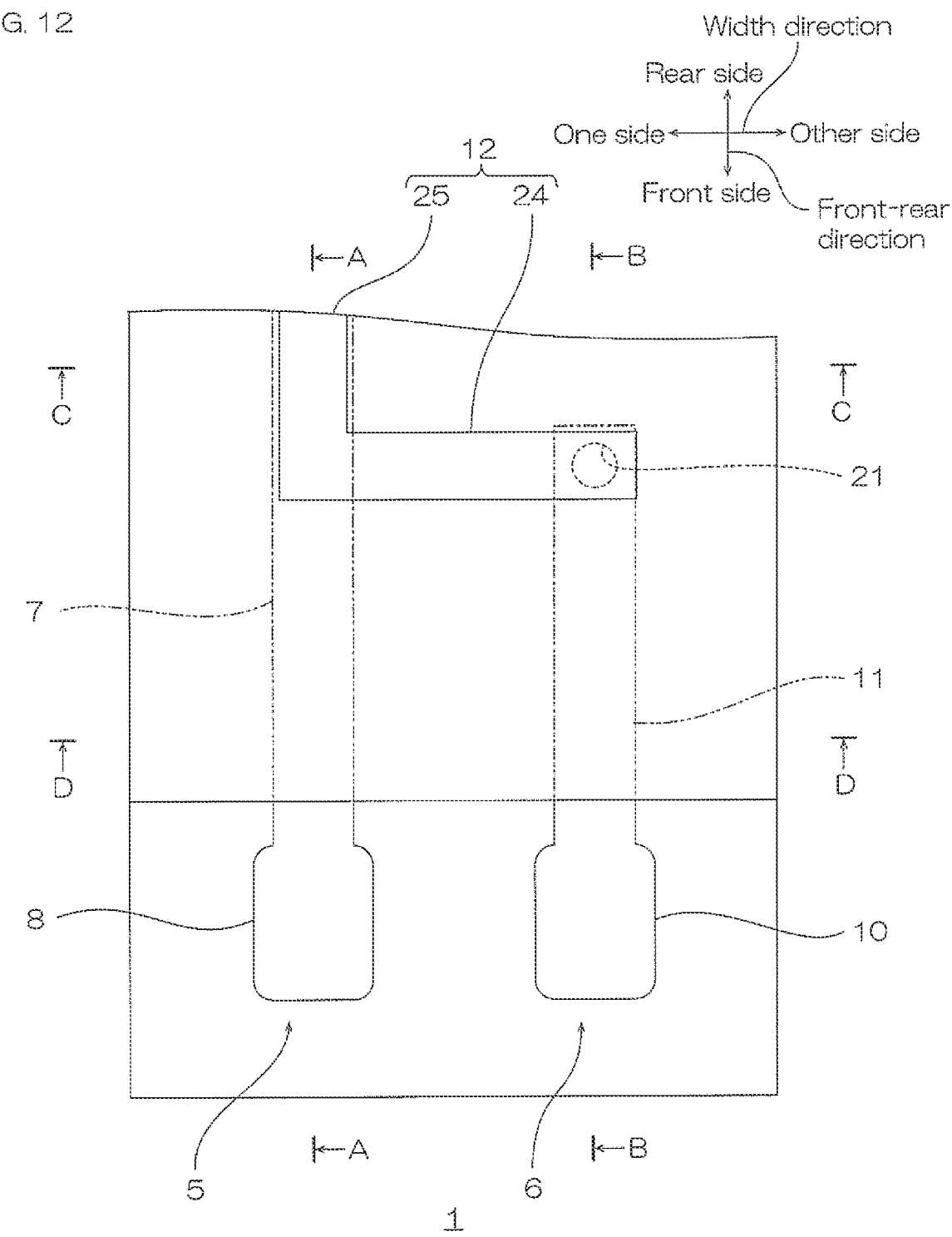
FIG. 12 shows a plan view of a modified example (modified example in which a first pattern portion and a second pattern portion are partially overlapped, and a second wiring is bent when viewed from the top) of the wiring circuit board shown in FIG. 1.

As shown in FIGS. 10 and 12, the first pattern portion 5 and the second pattern portion 6 are partially overlapped when viewed from the top. Specifically, a portion of the first wiring 7 and a portion of the second wiring 12 are overlapped when projected in the thickness direction.

Figure 11:
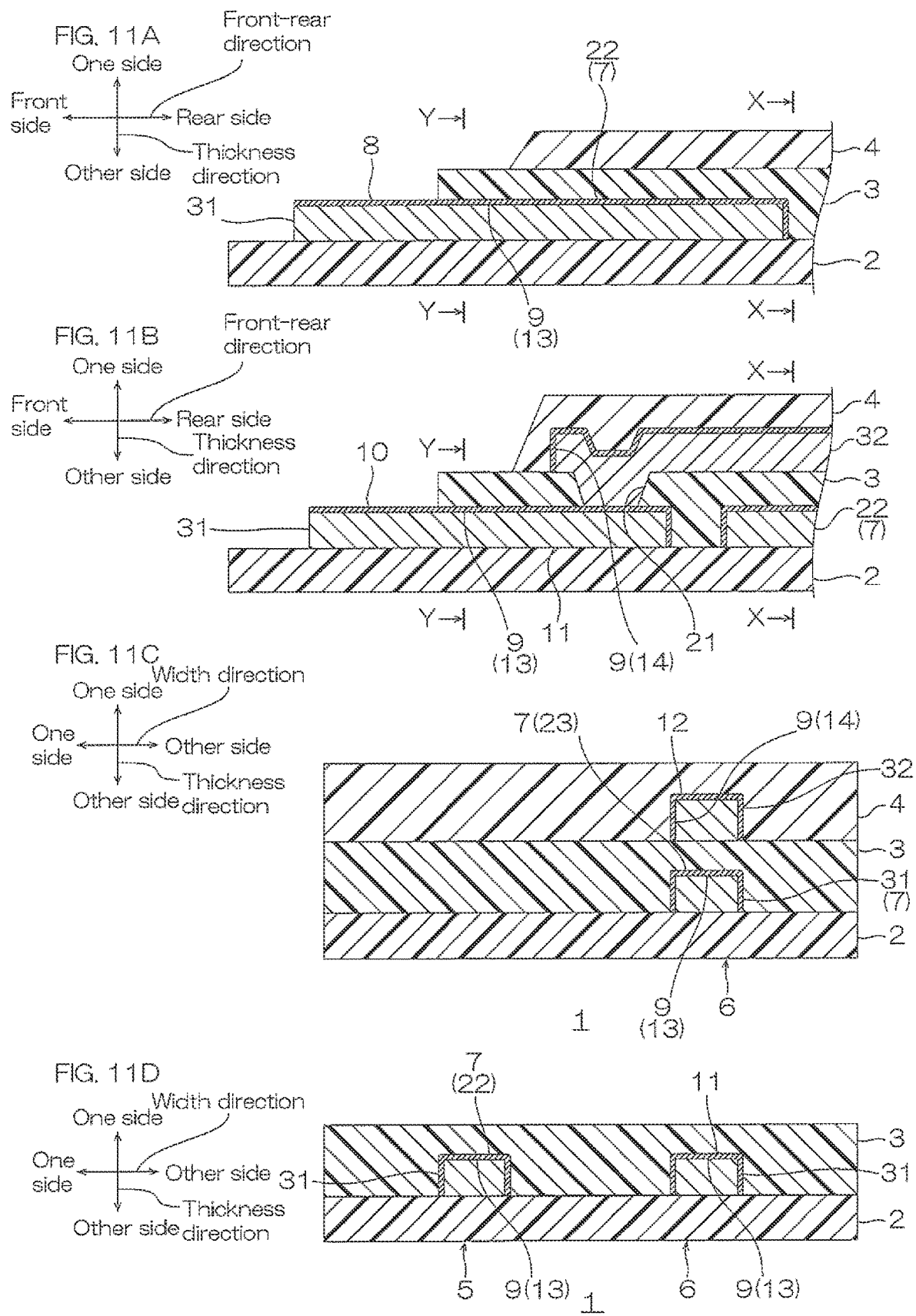
FIGS. 11A to 11D show cross-sectional views of the wiring circuit board shown in FIG. 10.

In the modified examples shown in FIGS. 10 to 11D, the first wiring 7 has a first non-overlapped portion 22 and a first overlapped portion 23.

The first non-overlapped portion 22 has a generally L-shape when viewed from the top. Specifically, when viewed from the top, the first non-overlapped portion 22 extends from the rear end edge of the first terminal 8 toward the rear side so as to be parallel to the second wiring 12, then, bends toward the second wiring 12-side (other side in the width direction), and reaches immediately before the second wiring 12.

When viewed from the top, the first overlapped portion 23 reaches the second wiring 12 from the other end edge in the width direction of the first non-overlapped portion 22, and extends toward the rear side, while overlapped with the second wiring 12.

On the other hand, in the modified examples shown in FIGS. 12 to 13D, the second wiring 12 has a generally L-shape when viewed from the top, and has a second non-overlapped portion 24 and a second overlapped portion 25.

The second non-overlapped portion 24 is not overlapped with the first wiring 7 in the thickness direction, and the second overlapped portion 25 is overlapped with the first wiring 7 when viewed from the top.

The second non-overlapped portion 24 extends from the intermediate via 21 toward the first wiring 7-side (one side in the width direction), and reaches immediately before the first wiring 7 when viewed from the top.

When viewed from the top, the second overlapped portion 25 reaches the first wiring 7 from one end edge in the width direction of the second non-overlapped portion 24 and thereafter, extends toward the rear side, while overlapped with the first wiring 7.

In the modified examples shown in FIGS. 10 to 13D, the first pattern portion 5 and the second pattern portion 6 are overlapped when viewed from the top.

In the modified examples shown in FIGS. 10 to 13D, since the first wiring 7 and the second wiring 12 are partially overlapped, it is possible to pull around the first wiring 7 and the second wiring 12 in a narrow space.

Next, in order to aid understanding of the present invention, the wiring circuit board 1 of Comparative Example 1 is described with reference to FIGS. 14A to 14F.

Figure 14A:
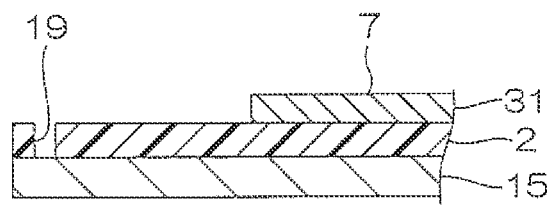
FIGS. 14A to 14F show process cross-sectional views of a method for producing a wiring circuit board of Comparative Example 1.
Figure 14B:
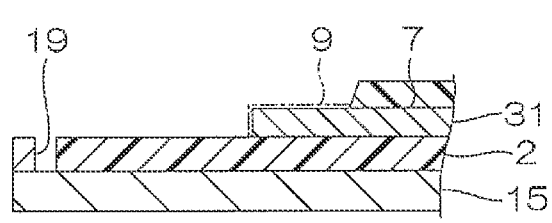
Figure 14C:
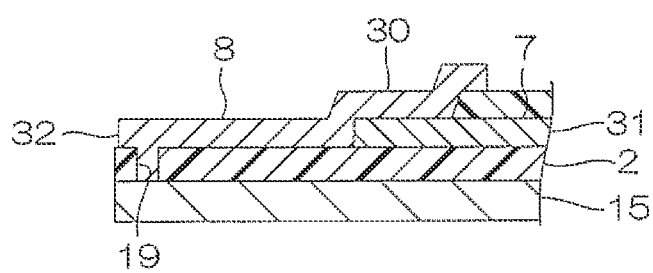
Figure 14D:
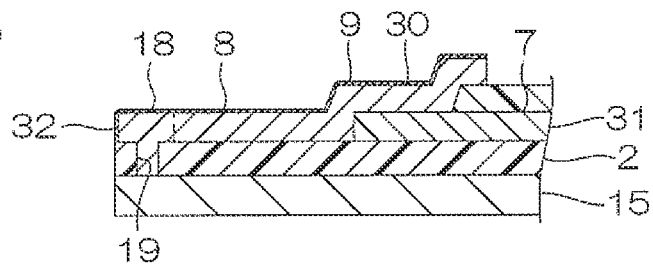
Figure 14E:
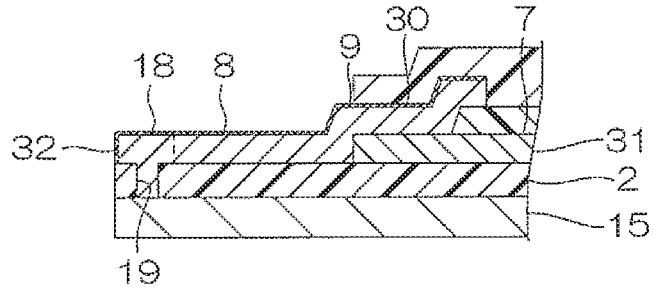
Figure 14F:
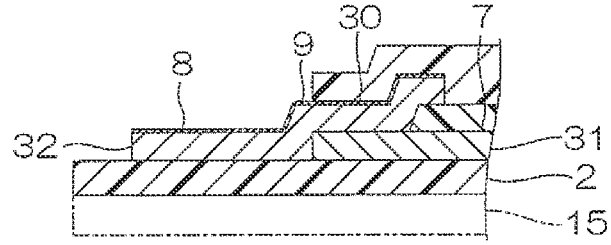

In Comparative Example 1, as shown in FIG. 14F, unlike one embodiment (ref: FIG. 2A), the first terminal 8 is discontinuous from the first wiring 7. The first terminal 8 is electrically connected to the first wiring 7 through the second connecting portion 30. The second connecting portion 30 is continuous with the rear end edge of the first terminal 8, extends from the rear end edge of the first terminal 8 toward the rear side, runs up a step formed by the front end portion of the first wiring 7, and is brought into contact with one surface in the thickness direction of the front end portion of the first wiring 7.

To produce the wiring circuit board 1 of Comparative Example 1, first, as shown in FIG. 14A, the first conductive layer 31 including the first wiring 7 is formed on one surface in the thickness direction of the base insulating layer 2. At this time, the first wiring 7 is not located in the front-side portion of the base insulating layer 2 (near region of the through hole 19).

Then, as shown by the solid line of FIG. 14B, the intermediate insulating layer 3 is formed on one surface in the thickness direction of the base insulating layer 2 so as to cover the first wiring 7, and subsequently, as shown in FIG. 14C, the first terminal 8 and the second conductive layer 32 including the second connecting portion 30 are formed on one surface in the thickness direction of the base insulating layer 2, and one surface in the thickness direction of the front end portion of the first wiring 7. At this time, the second lead 18 is also formed.

Then, as shown in FIG. 14D, the plating layer 9 is formed on the surfaces of the first terminal 8 and the second conductive layer 32 including the second connecting portion 30. However, the plating layer 9 is not formed on the surface of the first conductive layer 31 including the first wiring 7.

Thereafter, as shown in FIG. 14E, the cover insulating layer 4 is formed, and subsequently, as shown in FIG. 14F, the second lead 18 and the metal support layer 15 are removed in order.

Then, in the producing method of Comparative Example 1, as shown in FIG. 14B, since it is not possible to subject the surface of the first conductive layer 31 including the first wiring 7 exposed from the intermediate insulating layer 3 to stable plating using the through hole 19 and the metal support layer 15, it is not possible to form the uniform plating layer 9 (phantom line). That is, as shown in FIG. 14A, in the formation of the first wiring 7, there is a limit in a space for forming the first lead 17 so as to ensure the space for the first terminal 8 to be formed later, thus, the first lead 17 is difficult to be formed, and therefore, it is not possible to form the above-described plating layer 9 on the surface of the first conductive layer 31.

In contrast, in one embodiment, as shown in FIG. 3A, when the first conductive layer 31 including the first terminal 8 and the first wiring 7 which are continuous with each other is formed, the first lead 17 is also formed. Therefore, in the third step, as shown in FIG. 3B, it is possible to subject the surface of the first wiring 7 to stable plating using the through hole 19 and the metal support layer 15, and form the uniform plating layer 9.

As shown by the phantom line of FIG. 14B, even when plating is attempted to be applied to the surface of the first wiring 7 without the lead, there is no lead in the electrolytic plating, and therefore, it is not possible to supply electricity to the first wiring 7, and not possible to form the electrolytic plating layer on the surface of the first wiring 7. On the other hand, in the electroless plating, since the first wiring 7 is not grounded by the lead, an extremely non-uniform electroless plating layer is formed, and it is not possible to sufficiently protect the first terminal 8.

Further, as shown in FIGS. 3E and 4G, the wiring circuit board 1 may also include the metal support layer 15 without removing the metal support layer 15.

Further, the plating layer 9 may also include only one of the first plating layer 13 and the second plating layer 14. Furthermore, the wiring circuit board 1 also may not include the plating layer 9.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for various electronic applications.

DESCRIPTION OF REFERENCE NUMERALS

1 Wiring circuit board
2 Base insulating layer
3 Intermediate insulating layer
7 First wiring
8 First terminal
9 Plating layer
10 Second terminal
11 Connecting portion
12 Second wiring
17 First lead
18 Second lead
20 Auxiliary wiring
31 First conductive layer
32 Second conductive layer
T2 Thickness of first terminal
T3 Thickness of second wiring
T4 Thickness of second terminal

The invention claimed is:

1. A wiring circuit board comprising:
a base insulating layer;
a first conductive layer disposed on one surface in a thickness direction of the base insulating layer;
an intermediate insulating layer disposed on one surface in the thickness direction of the base insulating layer so as to cover the first conductive layer;
a second conductive layer disposed on one surface in the thickness direction of the intermediate insulating layer,
wherein the first conductive layer includes:
a first wiring;
a first terminal, which is a single layer, and electrically connected to the first wiring; and
a second terminal, which is a single layer;
a connecting portion continuous with the second terminal; and
an auxiliary wiring continuous with the connecting portion, and
wherein the second conductive layer includes:
a second wiring electrically connected to the connecting portion of the first conductive layer in the thickness direction.

2. The wiring circuit board according to claim 1 further comprising:
a plating layer disposed on one surface in the thickness direction and a side surface of the first wiring.

3. The wiring circuit board according to claim 1, wherein the second terminal has the same thickness as the first terminal.

4. The wiring circuit board according to claim 1, wherein the second terminal has a thickness of 20 μm or less.

5. The wiring circuit board according to claim 1, wherein the second wiring is thicker than the second terminal.

6. The wiring circuit board according to claim 1, wherein the second wiring is thicker than the first wiring.

7. A method for producing a wiring circuit board comprising:
a step of preparing a base insulating layer;
a step of forming a first conductive layer including a first wiring, a first terminal continuous with the first wiring, a lead continuous with the first terminal, a connecting portion, a second terminal continuous with the connecting portion, and an auxiliary wiring continuous with the connecting portion on one surface in a thickness direction of the base insulating layer;
a step of forming a plating layer on one surface in the thickness direction and a side surface of the first wiring and on one surface in the thickness direction and a side surface of the auxiliary wiring by plating using the lead;
a step of forming an intermediate insulating layer on one surface in the thickness direction of the base insulating layer so as to cover the plating layer; and
a step of forming a second conductive layer including a second wiring on one surface in the thickness direction of the intermediate insulating layer so as to allow the second wiring to be in contact with one surface in the thickness direction of the connecting portion.

8. A wiring circuit board comprising:
a base insulating layer;
a first conductive layer disposed on one surface in a thickness direction of the base insulating layer;
an intermediate insulating layer disposed on one surface in the thickness direction of the base insulating layer so as to cover the first conductive layer; and
a second conductive layer disposed on one surface in the thickness direction of the intermediate insulating layer,
wherein the first conductive layer includes:
a first wiring;
a first terminal, which is a single layer, and electrically connected to the first wiring; and
a second terminal, which is a single layer; and
a connecting portion continuous with the second terminal,
wherein the second conductive layer includes:
a second wiring electrically connected to the connecting portion of the first conductive layer in the thickness direction, and
wherein the second wiring is thicker than the second terminal.

9. The wiring circuit board according to claim 8 further comprising:
   a plating layer disposed on one surface in the thickness direction and a side surface of the first wiring.

10. The wiring circuit board according to claim 8, wherein the second terminal has the same thickness as the first terminal.

11. The wiring circuit board according to claim 8, wherein the second terminal has a thickness of 20 μm or less.

12. The wiring circuit board according to claim 8, wherein the second wiring is thicker than the first wiring.

13. A method for producing a wiring circuit board comprising:
   a step of preparing a base insulating layer;
   a step of forming a first conductive layer including a first wiring, a first terminal continuous with the first wiring, a lead continuous with the first terminal, a connecting portion, and a second terminal continuous with the connecting portion on one surface in a thickness direction of the base insulating layer;
   a step of forming a plating layer on one surface in the thickness direction and a side surface of the first wiring by plating using the lead;
   a step of forming an intermediate insulating layer on one surface in the thickness direction of the base insulating layer so as to cover the plating layer; and
   a step of forming a second conductive layer including a second wiring thicker than the second terminal on one surface in the thickness direction of the intermediate insulating layer so as to allow the second wiring to be in contact with one surface in the thickness direction of the connecting portion.

* * * * *